United States Patent
Ketonen et al.

(10) Patent No.: US 7,046,973 B2
(45) Date of Patent: May 16, 2006

(54) METHOD AND CIRCUITRY FOR HIGH POWER AMPLIFIERS WITH VOLTAGE CONVERSION TO AVOID PERFORMANCE DEGRADATION, SYSTEM SHUTDOWN AND PERMANENT DAMAGE IN CASE OF WORST CASE DATA PATTERN

(75) Inventors: Veli-Pekka Ketonen, Coppell, TX (US); Juha K. Maatta, Coppell, TX (US)

(73) Assignee: Nokia Corporation, Espoo (FI)

( * ) Notice: Subject to any disclaimer, the term of this patent is extended or adjusted under 35 U.S.C. 154(b) by 386 days.

(21) Appl. No.: 09/872,476

(22) Filed: Jun. 1, 2001

(65) Prior Publication Data

US 2002/0183023 A1 Dec. 5, 2002

(51) Int. Cl.
H04B 1/04 (2006.01)

(52) U.S. Cl. ............... 455/127; 455/127.1; 455/127.2; 455/127.5; 455/522

(58) Field of Classification Search ............... 455/522, 455/127.1, 127.2, 117, 118, 127.5; 330/207, 330/298
See application file for complete search history.

(56) References Cited

U.S. PATENT DOCUMENTS

| | | | | |
|---|---|---|---|---|
| 4,158,814 A | * | 6/1979 | Imazeki et al. | 455/78 |
| 4,635,297 A | * | 1/1987 | Polischuk | 455/217 |
| 5,426,395 A | * | 6/1995 | Cygan | 330/207 P |
| 5,621,762 A | | 4/1997 | Miller et al. | 375/298 |
| 5,930,299 A | | 7/1999 | Vannatta et al. | 375/269 |
| 6,351,189 B1 | * | 2/2002 | Hirvilampi | 330/296 |
| 2002/0039888 A1 | * | 4/2002 | Hama | 455/63 |

FOREIGN PATENT DOCUMENTS

JP 9252326 9/1997

* cited by examiner

*Primary Examiner*—Ahmad F. Matar
*Assistant Examiner*—Marie C. Ubiles
(74) *Attorney, Agent, or Firm*—Lackenbach Siegel, LLP

(57) ABSTRACT

A power amplification system for wireless communications monitors wireless signal sequences for worst case or problematic data patterns likely to cause the output voltage of a voltage converter supplying the power amplifier to drop. The signal sequences, which may be data within a single timeslot or data packet or across several timeslots or data packets, are detected by monitoring data patterns, either alone or in conjunction with monitoring voltage, current, or a combination of voltage and current drawn by the power amplifier. Upon detection of triggering signal sequences, the output power level is reduced, either digitally by dropping the output power one or more power levels or in an analog fashion by reducing reference voltages. Monitoring and control units may be included within the voltage converter, the power amplifier, a baseband modulator, and/or a transmission line-up unit.

20 Claims, 1 Drawing Sheet

METHOD AND CIRCUITRY FOR HIGH POWER AMPLIFIERS WITH VOLTAGE CONVERSION TO AVOID PERFORMANCE DEGRADATION, SYSTEM SHUTDOWN AND PERMANENT DAMAGE IN CASE OF WORST CASE DATA PATTERN

TECHNICAL FIELD OF THE INVENTION

The present invention is directed, in general, to power amplification in wireless communications devices and, more specifically, to preventing performance degradation in power amplification systems.

BACKGROUND OF THE INVENTION

Constant envelope modulation schemes employed in wireless communications, such as Gaussian minimum shift key (GMSK) modulation, involve direct current (DC) power requirements which are essentially independent of the data pattern(s) being transmitted. With non-constant envelope modulation schemes such as phase shift key (PSK) modulation with eight discrete amplitude levels (8-PSK), on the other hand, the maximum required power for power amplifiers varies depending on the data pattern. For certain data sequences, the maximum required direct current power is clearly above the normal average direct current power requirement. For instance, 8-PSK defines a crest factor (peak power divided by root mean square power) limit of 3.2 dB, which might lead to a peak power of 120 Watts (W) for a root mean square (RMS) power of 50 W, or peak power of 360 W for an RMS power of 150 W.

With such large variations in the required power, unless the voltage converter (AC/DC or DC/DC) for the power amplifier (other than Class A) has been designed for the absolute maximum peak power, system performance may be degraded when certain data patterns occur. As illustrated in FIG. 3, power requirements for random data patterns will normally average over a time slot 300, assuming a time division multiple access (TDMA) system is utilized. However, if the worst case data pattern (i.e., the data pattern requiring the highest peak output power) occurs during one time slot 301, the output voltage of the power amplifier may begin to drop during the next time slot 302. If successive time slots all contain the worst case data pattern, the voltage converter may not be able recover from the previous voltage drop and continue dropping the output voltage.

In addition to temporary service degradation, occurrence of the worst case data pattern, particularly in successive time slots, may result in the system shutting down. Additionally, repetition of the worst case data pattern may produce severe effects on the power amplifier performance and the voltage converter reliability, up to and including permanent damage to the equipment due to excessive current draw or long term thermal problems.

Since the probability of the worst case data pattern occurring at all—much less repeating successively—is usually very low, most power amplifier designs for wireless communications are based on average DC power at the maximum power level. However, multiple consecutive occurrences of the worst data pattern may still occasionally occur naturally. Moreover, the worst case data pattern may be calculated and synthesized for standardized systems, such as cellular networks. Such intentional generation of the worst case data pattern may result from a malicious purpose, by a competitor or individual desiring to disrupt the system and service.

There is, therefore, a need in the art to protect power amplifiers within wireless communications equipment from damage and to avoid system performance degradation or disruption.

SUMMARY OF THE INVENTION

To address the above-discussed deficiencies of the prior art, it is a primary object of the present invention to provide, for use in a wireless communications system, a power amplification system which monitors wireless signal sequences for worst case or problematic data patterns likely to cause the output voltage of a voltage converter supplying the power amplifier to drop. The signal sequences, which may be data within a single timeslot or data packet or across several timeslots or data packets, are detected by monitoring data patterns, either alone or in conjunction with monitoring voltage, current, or a combination of voltage and current drawn by the power amplifier. Upon detection of triggering signal sequences, the output power level is reduced, either digitally by dropping the output power one or more power levels or in an analog fashion by reducing reference voltages. Monitoring and control units may be included within the voltage converter, the power amplifier, a baseband modulator, and/or a transmission line-up unit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
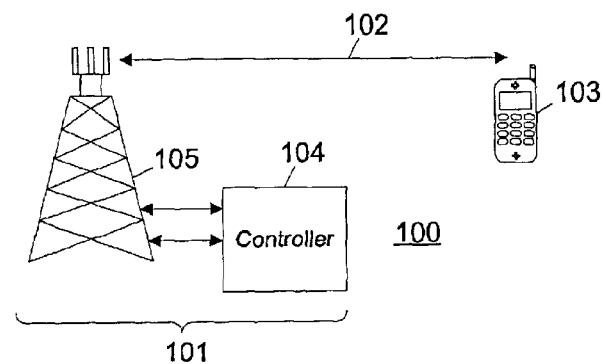
FIG. 1 depicts a wireless communications system implementing power amplification according to one embodiment of the present invention.
Figure 2:
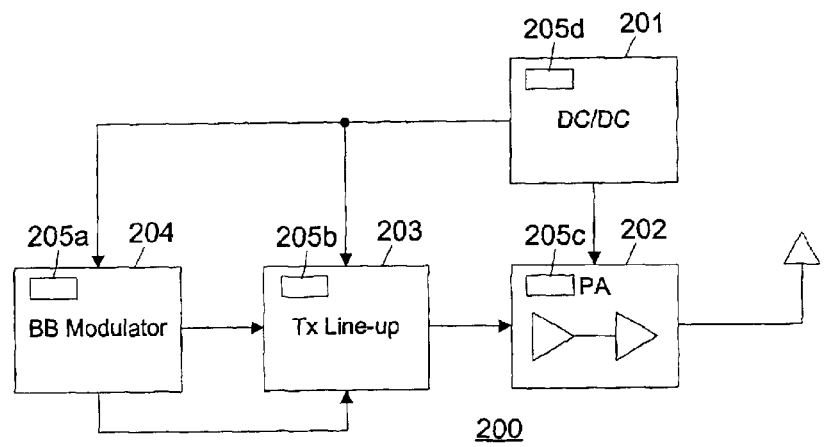
FIG. 2 illustrates in greater detail a power amplification system according to one embodiment of the present invention.
Figure 3:
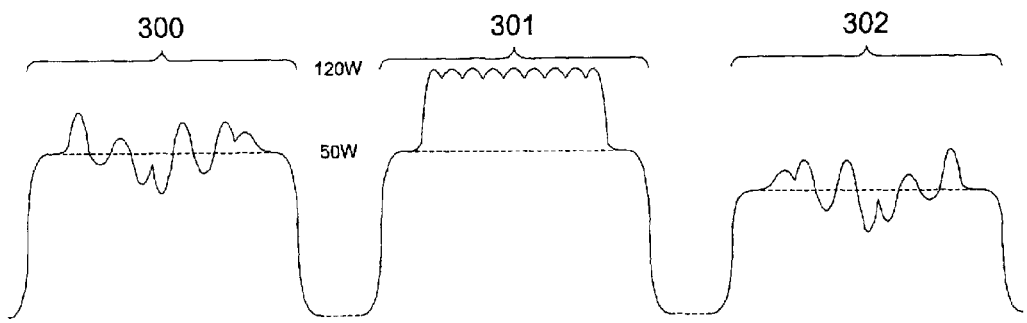
FIG. 3 is a diagram of performance degradation in power amplification systems due to occurrence of worst case data patterns.

FIGS. 1 through 2, discussed below, and the various embodiment used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts a wireless communications system implementing power amplification according to one embodiment of the present invention. Wireless communications system 100 includes a base station 101 communicating via a wireless communications channel 102 with a remote unit 103. Although depicted in FIG. 1 as a telephone, remote unit 103 may be alternatively be a mobile (e.g., laptop) computer or personal digital assistant (PDA) having a wireless modem, a wireless Internet access device, or a terrestrial broadcast television receiver. In the exemplary embodiment of FIG. 1, communications channel 102 is a time division multiple access (TDMA) channel in which phase shift key (PSK) modulation with eight discrete amplitude levels (8-PSK) is employed.

Base station 101 includes, among other components not shown, a controller 104 coupled to an antenna 105. In the present invention, either controller 104 or remote unit 103 includes a power amplification system detecting data patterns likely to degrade performance of a voltage converter within the power amplifier and preventing such performance degradation.

FIG. 2 illustrates in greater detail a power amplification system according to one embodiment of the present invention. Power amplification system 200 is implemented within controller 104, remote unit 103, or both in the present invention, and includes a voltage converter 201. Although illustrated in FIG. 2 as a direct current/direct current (DC/DC) voltage converter, an alternating current/direct current (AC/DC) may alternatively be employed.

Voltage converter 201 provides power to a power amplifier 202, which amplifies the signal level of a transmission data pattern received by power amplifier 202 from a transmission line-up unit 203. Transmission line-up unit 203 receives the transmission data pattern from a baseband (BE) modulator 204, which generates the data to be transmitted. Transmission line-up unit 203 buffers the transmission data and regulates the timing of transmission of each data packet. In the exemplary embodiment of FIG. 2, transmission line-up unit 203 includes power control functionality, which allows the power amplification system 200 to set the signal power level at which data is transmitted.

Those skilled in the art will recognize that data patterns likely to degrade system performance by drawing excessive power from the voltage converter 201 will vary depending on the channel coding, modulation coding, and data coding schemes employed by a particular system. However, worst case and/or (other) problematic data pattern(s) may be identified for specific systems. The present invention may employed in conjunction with a single, worst case data pattern or a number of data patterns determined to be likely to cause the output voltage of voltage converter 201 to drop if occurring either independently or successively (in any combination or in predetermined sequences).

In the present invention, power amplification system 200 includes one or more monitoring and/or control units 205a–205d for detecting and responding to the occurrence of data patterns likely to cause the power amplifier 202 to draw power from voltage converter 201 at a level likely to cause a subsequent drop in the output voltage of voltage converter 201. Detection of such data pattern(s) may be accomplished in several ways. Monitoring and/or control units—for example, monitoring/control units 205a and 205b within baseband modulator 204 or transmission line-up unit 203—may screen transmission data for predefined signal patterns. The predefined signal patterns, calculated as described above for the particular wireless communications system containing power amplification system 200 based upon channel, modulation and data coding, may be a data sequence for a single packet (or timeslot), combinations of data sequences for two or more successive packets, or both.

Alternatively, monitoring and/or control units such as monitoring/control units 205c and 205d within voltage converter 201 or power amplifier 202 may monitor either voltage, current, or a combination of voltage and current drawn by power amplifier 202. When the voltage, current or combined voltage and current exceeds a predetermined threshold, either instantaneously or for a specified duration, occurrence of one or more problematic data pattern(s) is presumed. Power amplification system 200 may, of course, implement monitoring/control units 205a–205d for both screening signal patterns and monitoring voltage and/or current.

Upon detection of one or more data pattern(s) likely to cause the output voltage of voltage converter 201 to subsequently drop, monitoring/control units 205a–205d provide feedback control signals to one or more components of power amplification system 200. Based upon such control signals, system performance degradation may be avoided in one or more of several ways. Monitoring/control unit 205a within baseband modulator 204 may prevent subsequent transmission of worst case and/or problematic data patterns until sufficient time elapses to allow voltage converter 201 to recover. The temporary lapse in transmission may be preferable, and easier to recover from, than system shutdown and/or permanent damage.

Monitoring/control unit 205b within transmission line-up unit 203 may similarly delay or defer subsequent transmission of worst case and/or problematic data patterns. However, transmission line-up unit 203 preferably includes power control. In systems where multiple discrete power levels may be utilized (e.g., levels at 2 dB intervals), monitoring/control unit 205b may also, or alternatively, lower the output power by one or more steps for a preselected number of timeslots or data packets, allowing the voltage converter 201 time to recover. Monitoring/control units 205c and 205d may also lower the output power, either independently or in conjunction with each other and with monitoring/control unit 205b.

The output power level may be lowered digitally by stepping down power levels (e.g., from level 0 to level 1). Alternatively, the power level may be lowered in an analog fashion by controlling reference voltages, within voltage converter 201, power amplifier 202, or both, so that the output power drops for a desired time, or by adjusting a power detector (not shown) providing feedback regarding the output power in order to affect the output power. Detection of problem data patterns and responsive lowering of output power may occur on a timeslot-by-timeslot basis, or may occur within a single timeslot.

Although not explicitly depicted in FIG. 2, signal lines may interconnect monitoring/control units 205a–205d, if present. Each monitoring/control unit 205a–205d may be implemented within power amplification system 200 independently of the others, or may be implemented in any combination and operate in a collaborative fashion. Each of monitoring/control units 205a–205d may implement a detection function, a control function, or both, and control functions within monitoring/control units 205a–205d may respond to either internal detection of a problematic data pattern or signals from other monitoring/control units 205a–205d indicating detection by such units of problematic data patterns.

One alternative to the present invention involves designing a voltage converter specified by the maximum peak power, an expensive option adding to system costs. The present invention avoids the excessive costs of over-specified voltage converters while allowing a system to avoid performance degradation or damage from worst case and/or problematic data patterns.

Although the present invention has been described in detail, those skilled in the art will understand that various changes, substitutions and alterations herein may be made without departing from the spirit and scope of the invention it its broadest form.

What is claimed is:

1. For use in a wireless communications system, a power amplification system for avoiding performance degradation, system shutdown or damage comprising:
    a power amplifier amplifying wireless signals to be transmitted;
    a voltage converter supplying power to the power amplifier;
    at least one monitoring unit detecting occurrence of a predetermined data pattern within the wireless signals to be transmitted, wherein the predetermined data pattern is likely to cause an undesirable drop in an output voltage from the voltage converter; and
    at least one control unit lowering an output power level of the power amplifier for a specified period in response to occurrence of the predetermined data pattern within the wireless signals to be transmitted.

2. The power amplification system as set forth in claim 1 wherein the predetermined data pattern further comprises:
    a data sequence within a single timeslot or data packet; or
    a combination of one or more data sequences across successive timeslots or data packets.

3. The power amplification system as set forth in claim 2 wherein the at least one monitoring unit detects act the data sequence or the combination of one or more data sequences.

4. The power amplification system as set forth in claim 1 wherein occurrence of the predetermined data pattern is detected by:
    a signal sequence; or
    a signal sequence in combination with a voltage, a current, or a combined voltage and current exceeding a threshold either instantaneously or for a specified duration.

5. The power amplification system as set forth in claim 4 wherein the at least one monitoring unit detects the voltage, the current, or the combined voltage and current.

6. The power amplification system as set forth in claim 1 wherein the at least one control unit lowers the output power by a defined increment.

7. The power amplification system as set forth in claim 1 wherein the at least one control unit lowers the output power by adjusting a power control reference voltage.

8. The power amplification system as set forth in claim 1 further comprising:
    a baseband modulator generating the wireless signals to be transmitted; and
    a transmission line-up unit controlling timing of transmission of the wireless signals to be transmitted,
    wherein the at least one monitoring unit and the at least one control unit are each located in one or more of the power amplifier, the voltage converter, the baseband modulator, and the transmission line-up unit.

9. The power amplification system as set forth in claim 8 wherein more than one of the power amplifier, the voltage converter, the baseband modulator, and the transmission line-up unit include a monitoring unit or a control unit.

10. The power amplification system as set forth in claim 1 wherein the power amplifier is specified for average output power at a maximum power level rather than absolute maximum peak power at the maximum power level.

11. A method of avoiding performance degradation, system shutdown or damage in a power amplification system comprising:
    amplifying wireless signals to be transmitted with a power amplifier;
    supplying power to the power amplifier from a voltage converter;
    detecting, at least one monitoring unit, occurrence of a predetermined data pattern within the wireless signals to be transmitted, wherein the predetermined data pattern is likely to cause an undesirable drop in an output voltage from the voltage converter; and
    employing at least one control unit to lower an output power level of the power amplifier for a specified period in response to occurrence of the predetermined data pattern within the wireless signals to be transmitted.

12. The method as set forth in claim 11 wherein the step of detecting occurrence of a predetermined data pattern within the wireless signals to be transmitted predetermined data pattern further comprises:
    detecting a data sequence within a single timeslot or data packet; or
    detecting a combination of one or more data sequences across successive timeslots or data packets.

13. The method as set forth in claim 12 wherein the steps of detecting the data sequence or detecting the combination of one or more data sequences are performed by the at least one monitoring unit.

14. The method as set forth in claim 11 wherein the step of detecting occurrence of a predetermined data pattern within the wireless signals to be transmitted predetermined data pattern further comprises:
    detecting a signal sequence; or
    detecting a signal sequence in combination with a voltage, a current, or a combined voltage and current exceeding a threshold either instantaneously or for a specified duration.

15. The method as set forth in claim 14 wherein the step of detecting a signal sequence in combination with a voltage, a current, or a combined voltage and current exceeding a threshold either instantaneously or for a specified duration is performed by the at least one monitoring unit.

16. The method as set forth in claim 11 wherein the step of employing at least one control unit to lower an output power level of the power amplifier for a specified period in response to occurrence of the predetermined data pattern within the wireless signals to be transmitted further comprises:

lowering the output power by a defined increment.

17. The method as set forth in claim 11 wherein the step of employing at least one control unit to lower an output power level of the power amplifier for a specified period in response to occurrence of the predetermined data pattern within the wireless signals to be transmitted further comprises:

lowering the output power by adjusting a power control reference voltage.

18. The method as set forth in claim 11 further comprising:

generating the wireless signals to be transmitted with a baseband modulator; and controlling timing of transmission of the wireless signals to be transmitted with a transmission line-up unit, wherein the at least one monitoring unit and the at least one control unit are each located in one or more of the power amplifier, the voltage converter, the baseband modulator, and the transmission line-up unit.

19. The method as set forth in claim 18 wherein the steps of detecting occurrence of a predetermined data pattern within the wireless signals to be transmitted or employing at least one control unit to lower an output power level of the power amplifier for a specified period in response to occurrence of the predetermined data pattern within the wireless signals to be transmitted are performed by more than one of the power amplifier, the voltage converter, the baseband modulator, and the transmission line-up unit.

20. The method as set forth in claim 11 wherein the step of amplifying wireless signals to be transmitted with a power amplifier further comprises:

employing a power amplifier specified for average output power at a maximum power level rather than absolute maximum peak power at the maximum power level.

* * * * *